(12) United States Patent
Hall et al.

(10) Patent No.: US 6,580,491 B2
(45) Date of Patent: Jun. 17, 2003

(54) APPARATUS AND METHOD FOR COMPENSATING FOR DISTORTION OF A PRINTED CIRCUIT WORKPIECE SUBSTRATE

(75) Inventors: Richard Ronald Hall, Endwell, NY (US); Robert Lee Lewis, Apalachin, NY (US); How Tzu Lin, Vestal, NY (US); Peter Michael Nichols, Johnson City, NY (US); Robert David Sebesta, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 09/749,044

(22) Filed: Dec. 26, 2000

(65) Prior Publication Data

US 2002/0085188 A1 Jul. 4, 2002

(51) Int. Cl.[7] .................. G03B 27/68; G03B 27/42; G01B 11/00
(52) U.S. Cl. ................. 355/52; 355/53; 356/399; 356/401
(58) Field of Search .................. 355/52, 53, 55; 430/22, 30; 356/399, 400, 401

(56) References Cited

U.S. PATENT DOCUMENTS

| | | | |
|---|---|---|---|
| 5,739,899 A | * | 4/1998 | Nishi et al. .................. 355/53 |
| 5,894,350 A | | 4/1999 | Hsieh et al. |
| 5,973,766 A | | 10/1999 | Matsuura et al. |
| 5,995,199 A | | 11/1999 | Shinozaki et al. |
| 5,999,244 A | | 12/1999 | Yanagihara et al. |
| 6,002,487 A | | 12/1999 | Shirata |
| 6,008,880 A | | 12/1999 | Higashiki et al. |
| 6,238,851 B1 | * | 5/2001 | Nishi .......................... 355/77 |

FOREIGN PATENT DOCUMENTS

| | | |
|---|---|---|
| JP | 11074190 | 3/1999 |
| JP | 11219900 | 8/1999 |

* cited by examiner

Primary Examiner—Russell Adams
Assistant Examiner—Peter B. Kim
(74) Attorney, Agent, or Firm—Andrew L. Ney; Arthur J. Samodovitz

(57) ABSTRACT

Apparatus and method for compensating for distortion of the substrate of a printed circuit workpiece that involves performing two tasks. First, a mask that carries functional circuit features and alignment features is positioned rotatably so that the mask alignment features, when projected onto a table that holds the printed circuit workpiece, will be on a line extending parallel to one of two orthogonal axes of the table. Second, the spacing of alignment features on the printed circuit workpiece is determined and this determination is a measure of the distortion of the printed circuit workpiece substrate. A lens through which the mask image is projected is moved to adjust the magnification of the image in accordance with the measured distortion of the substrate of the printed circuit workpiece.

17 Claims, 4 Drawing Sheets

APPARATUS AND METHOD FOR COMPENSATING FOR DISTORTION OF A PRINTED CIRCUIT WORKPIECE SUBSTRATE

TECHNICAL FIELD

The present invention relates, in general, to the production of printed circuit components and, in particular, to an apparatus and a method for compensating for distortions in the size of substrates of printed circuit workpieces by which the functional circuit features that are to be developed on the printed circuit component are expanded or contracted depending upon the nature of the distortion.

BACKGROUND OF THE INVENTION

It is common practice, in the fabrication of printed circuits, to: (1) project an image of the desired circuit onto a photoresist coating overlaying a metal layer on a substrate, (2) remove the imaged, soluble photoresist in a develop solution, (3) etch away those portions of the metal layer where the resist was removed in the develop process, and (4) remove the remaining photoresist that was used as the etch mask, leaving the desired metal layer circuit on the substrate. The metal layer circuit is often registered to underlying substrate features. Prior to the creation of the imaged metal circuit layer, the substrate might undergo certain process operations that cause change in the character of the substrate, such as it's size in both length and width.

With the use of certain substrate materials, for example ceramic substrates, these changes in size of the substrate can be predicted and the desired circuit features presented on the mask from which the image of the desired circuit features are projected onto the photoresist coating can be arranged to compensate for such changes in the substrate. With the use of certain other substrate materials, for example teflon, these changes in size of the substrate cannot be predicted with the required repeated accuracy. Therefore, the desired circuit features cannot be arranged to compensate for such changes in the substrate.

SUMMARY OF THE INVENTION

It is an objective of the present invention to provide a new and improved apparatus and method for compensating for distortions in the size of substrates of printed circuit workpieces by which the functional circuit features that are to be developed on the printed circuit component are expanded or contracted depending upon the nature of the distortion.

It is another objective of the present invention to provide such an apparatus and method that are accurate and cost effective.

According to the present invention, a mask bearing an image composed of a functional circuit feature and at least two alignment features is provided. Also provided is a table for holding a substrate containing at least one printed circuit workpiece having at least two alignment features. Light from a light source is projected through the mask and a lens to project the mask alignment features onto the table. Also provided are a sensor attached to the table and a camera. The sensor is moved to a position at least approximately at the projection of a first of the mask alignment features and data is developed of the movement of the sensor to a position at least approximately at the projection of the first of the mask alignment features. Next, the sensor is scanned along two orthogonal axes of the table through the projection of the first of the mask alignment features and data is developed of the scan of the sensor along both of the orthogonal axes through the projection of the first of the mask alignment features. Also, data is developed of the intensity of the light detected by the sensor as the sensor is scanned through the projection of the first of the mask alignment features. The sensor then is moved to a position at least approximately at the projection of a second of the mask alignment features and data is developed of the movement of the sensor to a position at least approximately at the projection of the second of the mask alignment features. Next, the sensor is scanned along the two orthogonal axes of the table through the projection of the second of the mask alignment features and data is developed of the scan of the sensor along both of the orthogonal axes through the projection of the second of the mask alignment features. Also, data is developed of the intensity of the light detected by the sensor as the sensor is scanned through the projection of the second of the mask alignment features. The mask is moved rotatably in response to the data of the scans of sensor and data of the light intensities, so that projections of the mask alignment features are on a line parallel to one of the orthogonal axes.

Further in accordance with the present invention, the table moved to position a first of the printed circuit workpiece alignment features into alignment with a camera and data is developed of the movement of the table to move the first of the printed circuit workpiece alignment features into alignment with the camera. The table then is moved to position a second of the printed circuit workpiece alignment features into alignment with the camera and data is developed of the movement of the table to move the second of the printed circuit workpiece alignment features into alignment with the camera. The mask is then moved rotatably in response to the data of the alignments of the printed circuit workpiece alignment features with the camera to adjust the orientation of the functional circuit feature and the lens is then moved vertically in response to the data of the alignments of the printed circuit workpiece alignment features with the camera to adjust the magnification of the functional circuit feature.

Further in accordance with the present invention, the data developed during mask alignment and workpiece alignment is combined to develop alignment offsets that are applied to the final positioning of the printed circuit workpiece under the optical axis of the lens. The light source then illuminates the projected circuit image onto photoresist on the printed circuit workpiece.

BRIEF DESCRIPTION OF THE DRAWINGS

For a better understanding of the present invention, together with other and further objectives, advantages and capabilities thereof, reference is made to the following disclosure and appended claims in connection with the drawings in which:

DETAILED DESCRIPTION OF THE INVENTION

The apparatus constructed in accordance with the present invention and the method practiced by the present invention that compensate for changes in size of a printed circuit workpiece substrate perform two major tasks. First, the rotational position of the mask that carries the functional circuit features to be projected onto the printed circuit workpiece is adjusted to position the alignment features on the mask, so that when the alignment features on the mask are projected onto a table that holds the printed circuit workpiece, the projected alignment features will be aligned on a line parallel to one of two axes "X" or "Y" of the table on which the printed circuit workpiece is held. Second, the degree of size change of the substrate of the printed circuit workpiece is determined and serves to adjust the magnification of the functional circuit features on the mask, so that when the functional circuit features on the mask are projected onto a printed circuit workpiece, the projected image of the functional circuit features compensates for changes in the size of the substrate of the printed circuit workpiece.

Figure 1:
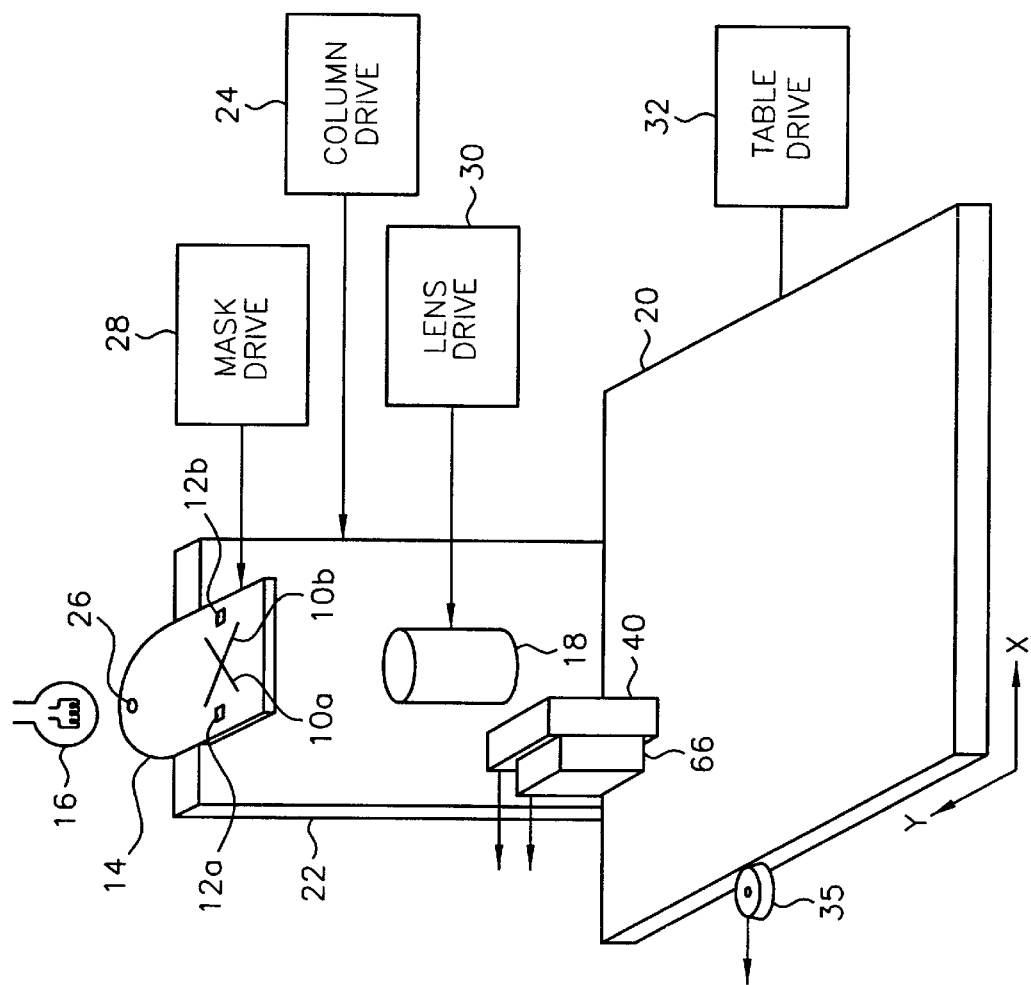
FIG. 1 is a perspective schematic view of apparatus, constructed in accordance with the present invention, for compensating for distortions in the size of substrates of printed circuit workpieces.
Figure 1:
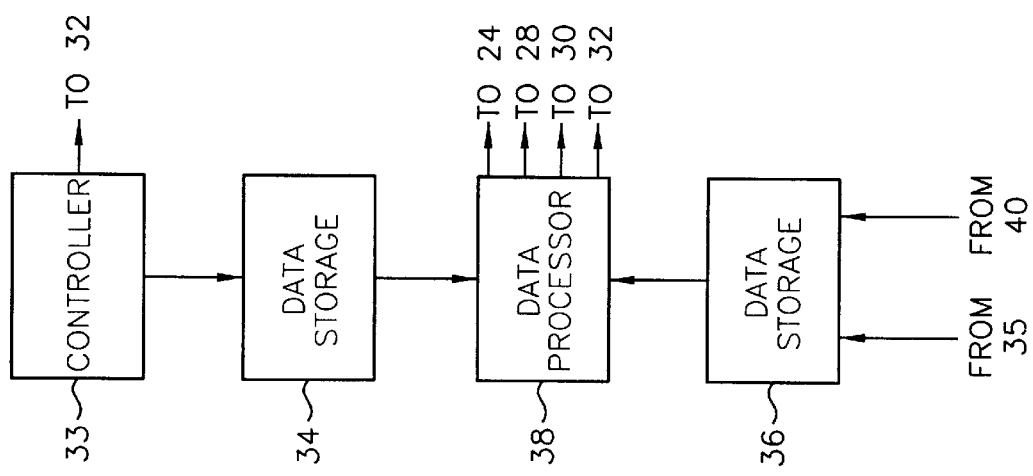

Referring to FIG. 1, an image, composed of a functional circuit feature represented by a pair of crossed lines 10a and 10b and a pair of alignment features 12a and 12b on a mask 14, typically glass, is projected by light from a light source 16, typically an arc lamp, through mask 14 and a lens 18, typically a 1× lens, onto a table 20. Mask 14, suitably mounted to a vertical column 22, is movable vertically relative to table 20 by a column drive 24 coupled to the vertical column and rotatably about a pivot axis 26 extending perpendicular to the mask by a mask drive 28 coupled to the mask. Lens 18, suitably mounted to vertical column 22 for vertical movement relative to table 20 and the vertical wall, is movable vertically by a lens drive 30 coupled to the lens. Table 20, suitably mounted for horizontal movement, has two orthogonal axes identified in FIG. 1 as "X" and "Y". Table 20 is moved by a table drive 32 coupled to the table and controlled by a controller 33.

The first task is to adjust alignment features 12a and 12b on mask 14 so that the projections of these alignment features on movable table 20 are on a line parallel to one of the two orthogonal axes "X" or "Y" of movable table 20. For the embodiment of the invention being described, alignment features 12a and 12b on mask 14 are to either side of the functional circuit feature 10a, 10b, so that the projected alignment features will be on a line parallel to the "X" axis of table 20. If the alignment features on mask 14 were above and below the functional circuit feature 10a, 10b, the alignment features would be adjusted to be on a line parallel to the "Y" axis of table 20.

Figure 2A:
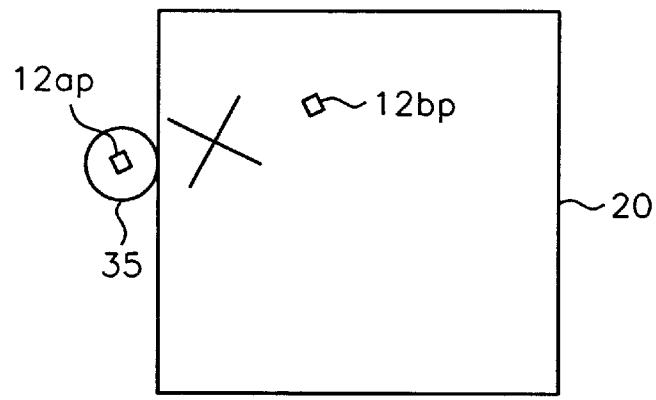
FIGS. 2A through 2C are plan views of the table of FIG. 1 and the steps performed by the FIG. 1 apparatus in determining the degree of rotational correction to be imparted to a mask bearing functional circuit features that are to be projected onto a printed circuit workpiece.

The first step in adjusting the alignment features 12a and 12b on mask 14 is to move table 20 in both the "X" and "Y" directions by table drive 32 under the control of controller 33, so that a sensor 35, attached to the table, is positioned at least approximately at the projection 12ap of the left-hand alignment feature 12a. This is shown in FIG. 2A. Data of the movement of table 20 is developed and stored, in response to movement of the table, by suitable means represented by a data storage 34.

Next, table 20 is caused to undergo small scan movements in both the "X" and "Y" directions by table drive 32 under the control of controller 33, so that sensor 35, attached to table 20, also is caused to undergo small scan movements along both the "X" and "Y" axes. The intensity of the light that is detected by sensor 35 varies as the sensor is scanned through the projection 12ap of left-hand alignment feature 12a. Data of these scan movements of table 20 is developed and stored, in response to movement of the table, in data storage 34. Data of the intensity of the light detected by sensor 35 is developed and stored, as the sensor is scanned through projection 12ap, by suitable means represented by a data storage 36. Specifically, the center points (i.e., points of maximum light intensity) of each scan are determined.

Figure 2B:
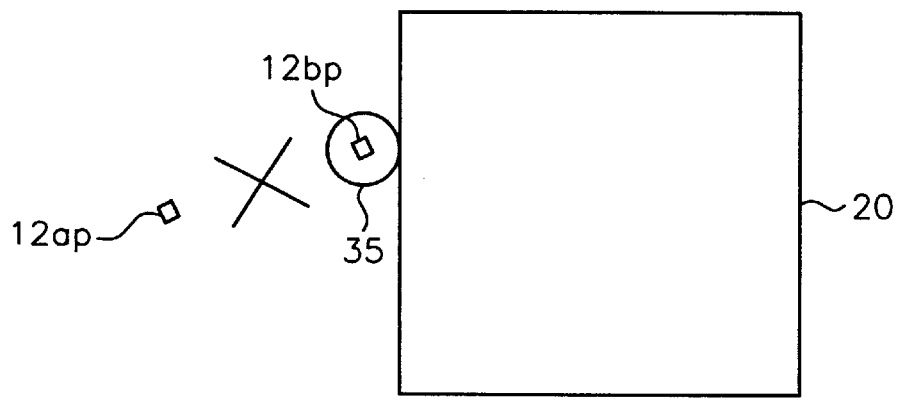

Next, table 20 is moved by table drive 32 under the control of controller 33, so that sensor 35, attached to the table, is positioned at least approximately at the projection 12bp of the left-hand alignment feature 12p. This is shown in FIG. 2B. Data of the movement of table 20 is developed and stored, in response to movement of the table, by suitable means represented by data storage 34.

Next, table 20 is caused to undergo small scan movements in both the "X" and "Y" directions by table drive 32 under the control of controller 33, so that sensor 35, attached to table 20, also is caused to undergo small scan movements along both the "X" and "Y" axes. The intensity of the light that is detected by sensor 35 varies as the sensor is scanned through the projection 12bp of left-hand alignment feature 12b. Data of these scan movements of table 20 is developed and stored, in response to movement of the table, in data storage 34. Data of the intensity of the light detected by sensor 35 is developed and stored, as the sensor is scanned through projection 12bp, by data storage 36. Specifically, the center points (i.e., points of maximum light intensity) of each scan are determined.

Figure 2C:
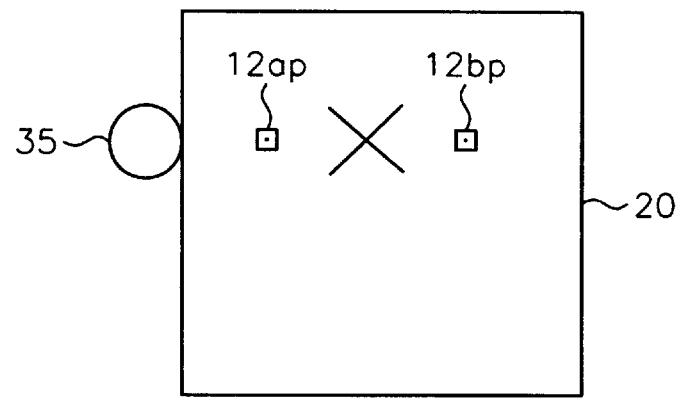

After the light intensity data and scan position data have been developed and stored, this data is processed by a data processor 38 to control rotational movement of mask 14 to bring the projected left-hand alignment feature 12ap and the projected right-hand alignment feature 12bp into alignment on a line parallel to the "X" axis of movement of table 20. In particular, the "Y" axis scan data for both the left-hand alignment feature and the right-hand alignment feature are compared to establish the controls necessary to control mask drive 28 to impart the needed rotation to mask 14 that will result in bringing the projected left-hand alignment feature 12ap and the projected right-hand alignment feature 12bp into alignment on a line parallel to the "X" axis of movement of table 20. This is shown in FIG. 2C. With alignment features above and below the functional circuit feature rather than to either side of the functional circuit feature, the "X" axis scans for both the upper alignment feature and the lower alignment feature are compared to control mask drive 28 to impart the needed rotation to mask 14 that will result in bringing the projected upper alignment feature and the projected lower alignment feature into alignment on a line parallel to the "Y" axis of table 20.

After the rotational correction of mask 14 has been determined, the center point data of the "X" and "Y" scans made at both the projection 12ap of left-hand alignment feature 12a and the projection 12bp of the right-hand projection 12b are compared with previously established reference positions to result in mask position offset data. Due to the relative position of the mask alignment features, the centerpoint of the actual projected image is known and represented by the mask alignment offset data.

After the mask alignment data and offsets data are established, the degree of size change and orientation of the printed circuit workpiece is determined to adjust the projection of the circuit feature on the printed circuit workpiece. This is accomplished by use of table drive 32 and a camera 40.

A printed circuit workpiece (not shown in FIG. 1), held on table 20, is positioned, so that a first alignment feature in the printed circuit workpiece is aligned with the axis of camera 40. Specifically, the printed circuit workpiece alignment feature is aligned with camera 40 by controller 33 positioning table 20 in both the "X" direction and the "Y" direction. Data of the alignment is developed and stored by data storage 34 and data storage 36. A second printed circuit workpiece alignment feature is aligned with camera 40 by controller 33 positioning table 20 in both the "X" direction and the "Y" direction. Again, similar data of table movement and camera alignment is developed and stored in data storage 34 and data storage 36.

Figure 3:
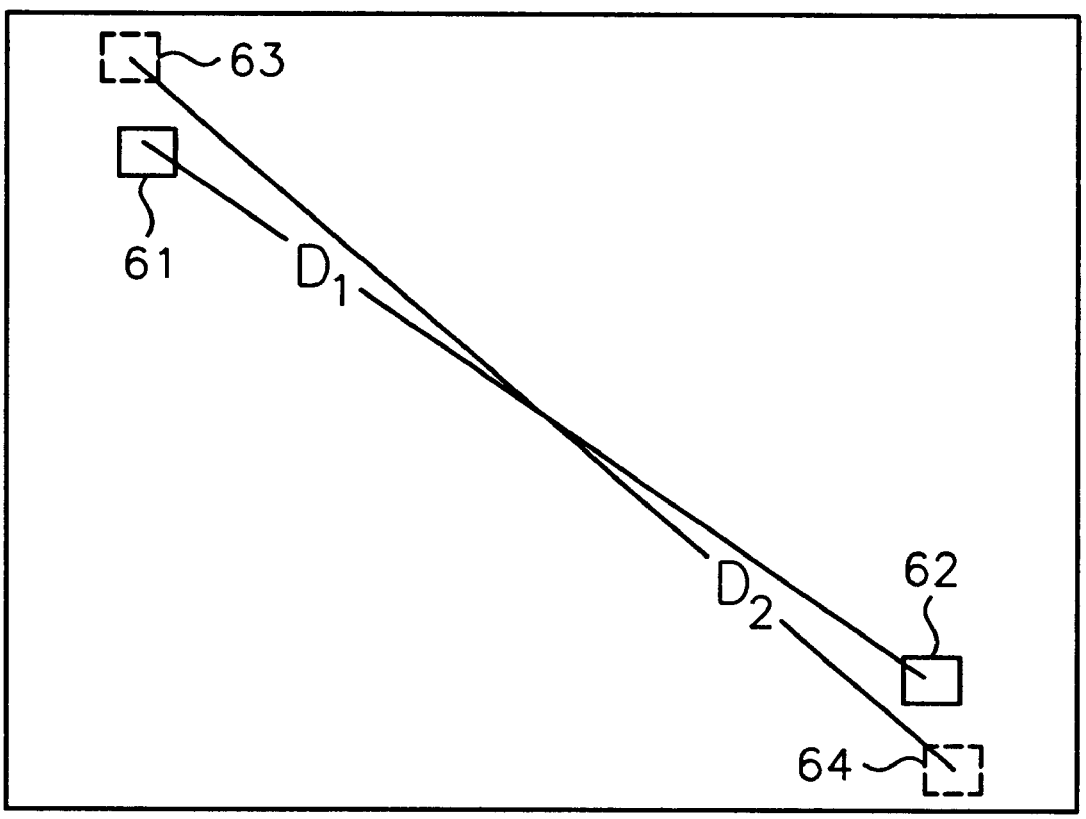
FIG. 3 is a plan view of a printed circuit workpiece showing the displacement of alignment features caused by distortion of the printed circuit workpiece substrate.

From this data stored by data storage 34 and data storage 36, data processor 38 determines the degree of distortion (i.e., expansion, contraction, rotation, position offset) in the area of the substrate represented by the printed circuit workpiece. This is accomplished by comparison of the locations of the printed circuit workpiece alignment features, as detected with camera 40, with the known reference locations, also stored in data storage 36. This is easily understood by the example illustrated in FIG. 3. Alignment features 61 and 62 are reference locations shown in solid lines at positions in a printed circuit workpiece prior to distortion of the substrate. Alignment features 63 and 64, shown in dashed lines, represent the distorted positions detected during alignment with camera 40. The reference alignment features are separated by a distance $D_1$ that is calculated to be less than the distorted alignment feature separation distance $D_2$, indicating that the substrate has expanded. The positional changes between the reference alignment features and the distorted alignment features are used to calculate the rotational error and the position offset errors in the "X" direction and the "Y" direction.

Distortion of the substrate of the printed circuit workpiece is compensated by controlling mask drive 28 to rotate mask 14 to adjust the orientation of the projected circuit feature and controlling lens drive 30 to move lens 18 to adjust the magnification of the circuit feature image for expansion or contraction of the printed circuit workpiece.

The printed circuit workpiece is then positioned under the optical axis of lens 18 to illuminate the projected circuit feature image. To accurately register the projected circuit feature to the printed circuit workpiece, with the orientation and magnification corrected, data processor 38 utilizes the mask alignment offset, the printed circuit workpiece alignment feature offset and the fixed offset value representing the distance between the axis of camera 40 and the optical axis of lens 18. Data processor 38 calculates the final position and table drive 32 moves table 20 to accurately align the printed circuit workpiece to the projected circuit feature image location.

The FIG. 1 apparatus for compensating for distortions in the size of substrates of printed circuit workpieces, constructed in accordance with the present invention, also includes a height sensor 66 for checking the height of mask 14 relative to the upper surface of a printed circuit workpiece held on table 20. In particular, height sensor 66 checks the focal height of mask 14 to control column drive 24 to move vertical column 22 and adjust the height of the mask to assure that the proper distance between the mask and the upper surface of the printed circuit workpiece to be fabricated is maintained as layers are added to the printed circuit workpiece.

Further in accordance with the present invention, the data developed during mask alignment and workpiece alignment is combined to develop alignment offsets that are applied to the final positioning of the printed circuit workpiece under the optical axis of the lens. Light source 16 then illuminates the projected circuit image onto photoresist on the printed circuit workpiece.

Figure 4:
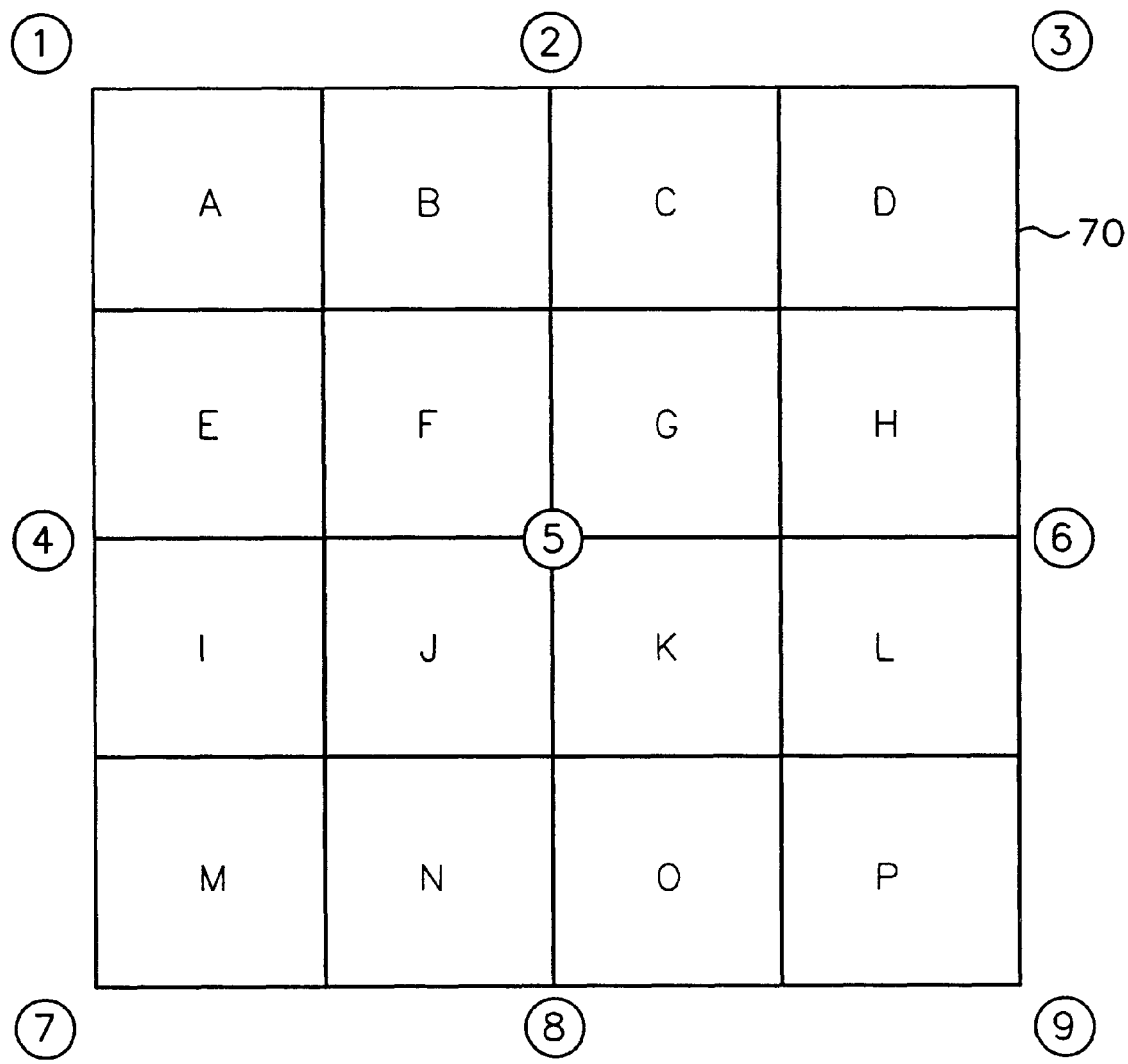
FIG. 4 is a schematic representation of a panel composed of a plurality of printed circuit workpieces.

FIG. 4 is a schematic representation of a panel 70 having a plurality of printed circuit workpieces A through P and a plurality of alignment features 1 through 9. The alignment features can be holes drilled in panel 70, as represented by alignment features 1 through 4 and 6 through 9, or a circuit feature, as represented by alignment feature 5. It should be noted that the present invention does not require sets of two or more alignment features associated with each workpiece. For the panel illustrated in FIG. 4, nine alignment features can be used to properly locate and position sixteen printed circuit workpieces and set the proper magnification.

Each of the alignment features 1 through 9 is brought into alignment with the axis of camera 40, as described above, by movement of table 20 on which panel 70 is placed. Data of these movements is collected and stored as described above.

For the embodiment of the invention being described, the rotation and magnification controls for each of the printed circuit workpieces and the printed circuit workpiece offsets are developed on a quadrant-by-quadrant basis. For example, for printed circuit workpiece A, the distances between alignment features 1 and 4, between alignment features 2 and 5, between alignment features 1 and 2, and between alignment features 4 and 5 are determined. The offset in the "X" direction for printed circuit workpieces A, B, E and F is developed from a comparison of the average of the distances between alignment features 1 and 2 and between alignment features 4 and 5 against the distance between the reference locations of the alignment features (i.e., the positions of these alignment features in the panel prior to distortion of the substrate) and the offset in the "Y" direction for printed circuit workpieces A, B, E and F is developed from a comparison of the average of the distances between alignment features 1 and 4 and between alignment features 2 and 5 against the distance between the reference locations of the alignment features.

Either of these offset determinations can be used for the magnification control for printed circuit workpieces A, B, E and F. However, for mask images having a greater vertical dimension than the horizontal dimension, the "Y" direction offset determination is preferred for magnification control, while for mask images having a greater horizontal dimension than the vertical dimension, the "X" direction offset is preferred for magnification control.

Rotation control of printed circuit workpieces A, B, E and F is determined from the degree of displacements of the alignment features from the references in the "X" and the "Y" directions. If, for example, alignment feature 1 has not been displaced, but alignment feature 2 has been displaced upward and to the left from the position shown in FIG. 4, the rotation control for printed circuit workpieces A, B, E and F is determined by the degree of displacement of alignment feature 2 in the vertical direction and the horizontal dimension from the position shown in FIG. 4.

The rotation and magnification controls for the other printed circuit workpieces in the other three quadrants and the printed circuit workpiece offsets for the other printed circuit workpieces in the other three quadrants are developed, in a similar manner, on a quadrant-by-quadrant basis.

While there have been shown and described what are at present considered the preferred embodiments of the present invention, it will be obvious to those skilled in the art that various changes and modifications may be made therein without departing from the scope of the invention as defined by the appended claims.

What is claimed:

1. Apparatus for compensating for distortions in the size of substrates of printed circuit workpieces having at least two alignment features, said apparatus comprising:
   a mask:
   (a) bearing an image composed of a functional circuit feature and at least two alignment features, and
   (b) rotatably movable about an axis extending perpendicular to said mask;
   a mask drive for moving said mask rotatably about said axis extending perpendicular to said mask;
   a table:
   (a) for holding a printed circuit workpiece having at least two alignment features,
   (b) movable horizontally, and
   (c) having two orthogonal axes;
   a table drive for moving said table horizontally;
   a lens movable vertically relative to said table;
   a lens drive for moving said lens vertically relative to said table;
   a light source for projecting light through said mask and said lens to project said mask alignment features onto said table;
   a sensor attached to said table for detecting projections of said mask alignment features;
   a camera for viewing said printed circuit workpiece alignment features;
   a controller for controlling said table drive to:
   (a) move said sensor to a position at least approximately at the projection of a first of said mask alignment features,
   (b) scan said sensor along both of said orthogonal axes through the projection of said first of said mask alignment features,
   (c) move said sensor to a position at least approximately at the projection of a second of said mask alignment features,
   (d) scan said sensor along both of said orthogonal axes through the projection of said second of said mask alignment features,
   (e) move said table to position a first of said printed circuit workpiece alignment features into alignment with said camera, and
   (f) move said table to position a second of said printed circuit workpiece alignment features into alignment with said camera; and
   control means responsive to:
   (a) movement of said table for developing and storing:
      (1) data of the movement of said sensor to a position at least approximately at the projection of said first of said mask alignment features,
      (2) data of the scan of said sensor along both of said orthogonal axes through the projection of said first of said mask alignment features,
      (3) data of the movement of said sensor to a position at least approximately at the projection of said second of said mask alignment features,
      (4) data of the scan of said sensor along both of said orthogonal axes through the projection of said second of said mask alignment features,
      (5) data of the movement of said table to move said first of said printed circuit workpiece alignment features into alignment with said camera, and
      (6) data of the movement of said table to move said second of said printed circuit workpiece alignment features into alignment with said camera,
   (b) said sensor for developing and storing:
      (1) data of the intensity of the light detected by said sensor as said sensor is scanned through the projection of said first of said mask alignment features, and
      (2) data of the intensity of the light detected by said sensor as said sensor is scanned through the projection of said second of said mask alignment features,
   (c) said camera for developing and storing:
      (1) data the of the alignment of said first of said printed circuit workpiece alignment features with said camera, and
      (2) data the of the alignment of said second of said printed circuit workpiece alignment features with said camera
   for controlling:
   (a) said mask drive to rotatably move said mask in response to said data of the scans of said sensor and data of the light intensities, so that projections of said mask alignment features are on a line parallel to one of said orthogonal axes,
   (b) said mask drive to rotatably move said mask in response to said data of the alignments of said printed circuit workpiece alignment features with said camera to adjust the orientation of said functional circuit feature, and
   (c) said lens drive to vertically move said lens in response to said data of the alignments of said printed circuit workpiece alignment features with said camera to adjust the magnification of said functional circuit feature.

2. Apparatus according to claim 1 wherein:
   (a) said control means combine said data developed and stored by said control means to control positioning of the printed circuit workpiece under said lens, and
   (b) said light source illuminates the functional circuit feature onto the printed circuit workpiece.

3. Apparatus according to claim 2 further including:
   (a) a vertically movable column on which said mask is mounted for vertical movement,
   (b) a height sensor for checking the height of said mask relative to a printed circuit workpiece held on said table, and
   (c) a column drive for moving said mask vertically to adjust the height of said mask to maintain a desired distance between said mask and the upper surface of the printed circuit workpiece held on said table.

4. Apparatus according to claim 1 wherein:
   (a) said control means:
      (1) store data of the reference locations of the printed circuit workpiece alignment features, and
      (2) compare the data of the reference locations of the printed circuit workpiece alignment features with:
         (i) the stored data of the alignment of said first of said printed circuit workpiece alignment features with said camera, and
         (ii) the stored data of the alignment of said second of said printed circuit workpiece alignment features with said camera
   to determine distortion of the substrate of said printed circuit workpiece, and (b) said control means:
  (1) control said mask drive to rotatably move said mask to adjust the orientation of an image of the circuit feature, and
  (2) control said lens drive to vertically move said lens to adjust the magnification of an image of the circuit feature.

5. A method for compensating for distortions in the size of substrates of printed circuit workpieces having at least two alignment features, said method comprising the steps of:

providing a mask bearing an image composed of a functional circuit feature and at least two alignment features;

providing a table for holding a printed circuit workpiece having at least two alignment features;

providing a lens;

providing a light source;

projecting light from said light source through said mask and said lens to project said mask alignment features onto said table;

providing a sensor attached to said table;

providing a camera;

moving said sensor to a position at least approximately at the projection of a first of said mask alignment features;

developing data of the movement of said sensor to a position at least approximately at the projection of said first of said mask alignment features;

scanning said sensor along two orthogonal axes of said table through the projection of said first of said mask alignment features;

developing data of the scan of said sensor along both of said orthogonal axes through the projection of said first of said mask alignment features;

developing data of the intensity of the light detected by said sensor as said sensor is scanned through the projection of said first of said mask alignment features;

moving said sensor to a position at least approximately at the projection of a second of said mask alignment features;

developing data of the movement of said sensor to a position at least approximately at the projection of said second of said mask alignment features;

scanning said sensor along said two orthogonal axes of said table through the projection of said second of said mask alignment features;

developing data of the scan of said sensor along both of said orthogonal axes through the projection of said second of said mask alignment features;

developing data of the intensity of the light detected by said sensor as said sensor is scanned through the projection of said second of said mask alignment features;

moving said mask rotatably in response to said data of the scans of said sensor and data of said light intensities, so that projections of said mask alignment features are on a line parallel to one of said orthogonal axes;

moving said table to position a first of said printed circuit workpiece alignment features into alignment with said camera;

developing data of the movement of said table to move said first of said printed circuit workpiece alignment features into alignment with said camera;

moving said table to position a second of said printed circuit workpiece alignment features into alignment with said camera;

developing data of the movement of said table to move said second of said printed circuit workpiece alignment features into alignment with said camera;

moving said mask rotatably in response to said data of the alignments of said printed circuit workpiece alignment features with said camera to adjust the orientation of said functional circuit feature; and moving said lens vertically in response to said data of the alignments of said printed circuit workpiece alignment features with said camera to adjust the magnification of said functional circuit feature.

6. A method according to claim 5 further including the steps of:
(a) combining said data that has been developed and stored to control positioning of the printed circuit workpiece under said lens, and
(b) illuminating the functional circuit feature onto the printed circuit workpiece by said light source.

7. A method according to claim 6 further comprising the steps of:
(a) checking the height of said mask relative to a printed circuit workpiece held on said table, and
(b) moving said mask vertically to adjust the height of said mask to maintain a desired distance between said mask and the upper surface of the printed circuit workpiece held on said table.

8. A method according to claim 5 further including the steps of:

storing data of the reference locations of the printed circuit workpiece alignment features;

comparing the data of the reference locations of the printed circuit workpiece alignment features with:
(a) data of the movement of said table to move said first of said printed circuit workpiece alignment features into alignment of with said camera, and
(b) data of the movement of said table to move said second of said printed circuit workpiece alignment features into alignment with said camera to determine distortion of the substrate of said printed circuit workpiece.

9. A method according to claim 8 further including the steps of:
(a) positioning the printed circuit workpiece under said lens, and
(b) illuminating an image of the circuit feature on the printed circuit workpiece.

10. A method for compensating for distortions in the sizes of substrates of a plurality of printed circuit workpieces in a panel having alignment features associated with the printed circuit workpieces, said method comprising the steps of:
(a) providing a mask bearing an image composed of a functional circuit feature and at least two alignment features:
(b) providing a table for holding a panel of printed circuit workpieces having alignment features associated with the printed circuit workpieces;
(c) providing a lens;
(d) providing a light source;
(e) projecting light from said light source through said mask and said lens to project said mask alignment features onto said table;
(f) providing a sensor attached to said table;
(g) providing a camera;
(h) moving said sensor to a position at least approximately at the projection of a first of said mask alignment features;

(i) developing data of the movement of said sensor to a position at least approximately at the projection of said first of said mask alignment features;

(j) scanning said sensor along two orthogonal axes of said table through the projection of said first of said mask alignment features;

(k) developing data of the scan of said sensor along both of said orthogonal axes through the projection of said first of said mask alignment features;

(l) developing data of the intensity of the light detected by said sensor as said sensor is scanned through the projection of said first of said mask alignment features;

(m) moving said sensor to a position at least approximately at the projection of a second of said mask alignment features;

(n) developing data of the movement of said sensor to a position at least approximately at the projection of said second of said mask alignment features, (o) scanning said sensor along said two orthogonal axes of said table through the projection of said second of said mask alignment features;

(p) developing data of the scan of said sensor along both of said orthogonal axes through the projection of said second of said mask alignment features;

(q) developing data of the intensity of the light detected by said sensor as said sensor is scanned through the projection of said second of said mask alignment features;

(r) moving said mask rotatably in response to said data of the scans of said sensor and data of said light intensities, so that projections of said mask alignment features are on a line parallel to one of said orthogonal axes;

(s) moving said table to position a first of said printed circuit workpiece alignment features into alignment with said camera;

(t) developing data of the movement of said table to move said first of said printed circuit workpiece alignment features into alignment with said camera;

(u) moving said table to position a second of said printed circuit workpiece alignment features into alignment with said camera;

(v) developing data of the movement of said table to move said second of said printed circuit workpiece alignment features into alignment with said camera;

(w) moving said mask rotatably in response to said data of the alignments of said printed circuit workpiece alignment features with said camera to adjust the orientation of said functional circuit feature;

(x) moving said lens vertically in response to said data of the alignments of said printed circuit workpiece alignment features with said camera to adjust the magnification of said functional circuit feature; and (y) repeating steps (e) and (h) through (x) for additional printed circuit workpieces in the panel.

11. A method according to claim 10 wherein:

(a) said first printed circuit workpiece alignment feature and said second printed circuit workpiece alignment feature are associated with at least two printed circuit workpieces in a sector of the panel, and (b) the data developed in steps (t) and (v) adjust the orientation and magnification of said functional circuit feature for each printed circuit workpiece in said sector of the panel.

12. A method for aligning a printed circuit board with light from a light source passing through a mask and lens, said mask including first and second reference features, said printed circuit board including third and fourth reference features and being supported on a table, said method comprising the steps of:

aligning light passing through said first reference feature with a sensor coupled to said table and recording a corresponding first position of said mask;

aligning light passing through said second reference feature with said sensor and recording a corresponding second position of said mask;

aligning said third reference feature with a camera and recording a corresponding third position of said printed circuit board;

aligning said fourth reference feature with said camera and recording a corresponding fourth position of said printed circuit board;

aligning an axis of said mask in a plane of said mask with a corresponding axis of said printed circuit board in a plane of said printed circuit board by rotating the mask about an axis perpendicular to its plane or rotating the table about an axis perpendicular to its plane, an amount and direction of said rotation(s) being based on said first and second positions and said third and fourth positions;

centering the mask with the printed circuit board along said planar axes based on said first and second positions and said third and fourth positions;

determining an amount of shrinkage and expansion of said printed circuit board based on a length between said third and fourth positions, and adjusting a distance between said lens and said printed circuit board to compensate for said shrinkage or expansion; and subsequently operating upon said printed circuit board with said light source via said mask and lens.

13. A method as set forth in claim 12 wherein said first and second reference features are first and second windows, respectively, in said mask.

14. A method as set forth in claim 12 wherein said sensor is attached to said table.

15. A method as set forth in claim 12 wherein said light source operates upon said printed circuit board by exposing photosensitive material of said printed circuit board.

16. A method as set forth in claim 12 wherein said printed circuit board comprises a ceramic substrate.

17. A method as set forth in claim 12 wherein said printed circuit board comprises an organic substrate.

* * * * *